(12) United States Patent
Srirattana

(10) Patent No.: US 10,498,383 B2
(45) Date of Patent: Dec. 3, 2019

(54) ATTENUATION CIRCUITS WITH LOW INSERTION LOSS, AND MODULES AND DEVICES USING SAME

(71) Applicant: SKYWORKS SOLUTIONS, INC., Woburn, MA (US)

(72) Inventor: Nuttapong Srirattana, Billerica, MA (US)

(73) Assignee: SKYWORKS SOLUTIONS, INC., Woburn, MA (US)

(*) Notice: Subject to any disclaimer, the term of this patent is extended or adjusted under 35 U.S.C. 154(b) by 0 days.

(21) Appl. No.: 15/440,028

(22) Filed: Feb. 23, 2017

(65) Prior Publication Data

US 2017/0250723 A1 Aug. 31, 2017

Related U.S. Application Data

(60) Provisional application No. 62/365,065, filed on Jul. 21, 2016, provisional application No. 62/300,134, filed on Feb. 26, 2016.

(51) Int. Cl.
  *H04B 1/40* (2015.01)
  *H01P 5/02* (2006.01)
  *H03H 11/24* (2006.01)

(52) U.S. Cl.
  CPC .............. *H04B 1/40* (2013.01); *H01P 5/02* (2013.01); *H03H 11/245* (2013.01)

(58) Field of Classification Search
  CPC ............ H04B 1/40; H01P 5/02; H03H 11/245
  See application file for complete search history.

(56) References Cited

U.S. PATENT DOCUMENTS

| | | | |
|---|---|---|---|
| 3,882,484 A | 5/1975 | Brokaw et al. | |
| 5,157,323 A | 10/1992 | Ali et al. | |
| 5,912,599 A | 6/1999 | Beall | |
| 6,094,055 A * | 7/2000 | Dosdall | H03H 7/255 324/601 |
| 6,462,327 B1 | 10/2002 | Ezell et al. | |
| 6,472,948 B1 * | 10/2002 | Kyriakos | H01P 1/22 327/306 |
| 6,489,856 B1 | 12/2002 | Weigand | |
| 6,876,271 B2 | 4/2005 | Evers et al. | |

(Continued)

FOREIGN PATENT DOCUMENTS

EP  2722984 A2  4/2014

OTHER PUBLICATIONS

International Search Report and Written Opinion from corresponding International Application No. PCT/US2017/019044 dated May 24, 2017.

(Continued)

*Primary Examiner* — Nguyen T Vo
(74) *Attorney, Agent, or Firm* — Lando & Anastasi, LLP

(57) ABSTRACT

An attenuation circuit with a low insertion loss is provided. The attenuation circuit includes an input to receive an input signal, an output to provide an attenuated signal, an attenuator coupled between the input and the output, the attenuator being configured to attenuate the input signal, an isolation switch constructed to isolate the attenuator from the input or the output when in a bypass mode, and a bypass switch coupled in parallel with the attenuator to couple the input to the output when in the bypass mode.

20 Claims, 19 Drawing Sheets

(56) References Cited

U.S. PATENT DOCUMENTS

| | | | |
|---|---|---|---|
| 7,196,566 | B2 | 3/2007 | Kaiser, Jr. |
| 7,868,681 | B2 | 1/2011 | van der Wagt |
| 8,970,296 | B1* | 3/2015 | Pratt .................... H03F 1/3205 |
| | | | 330/302 |
| 8,975,947 | B1 | 3/2015 | Seshita |
| 9,531,359 | B1* | 12/2016 | Shrivastava ............ H03K 5/08 |
| 10,193,520 | B2 | 1/2019 | Bergsma |
| 2001/0033206 | A1 | 10/2001 | Constantine et al. |
| 2002/0119797 | A1* | 8/2002 | Woodhead ............ H04W 52/24 |
| | | | 455/522 |
| 2006/0244548 | A1 | 11/2006 | Noest et al. |
| 2008/0100404 | A1 | 5/2008 | Vice |
| 2008/0122693 | A1 | 5/2008 | Needham et al. |
| 2008/0218269 | A1 | 9/2008 | Kirisawa |
| 2010/0141363 | A1* | 6/2010 | Yan ........................ H01P 1/227 |
| | | | 333/81 R |
| 2010/0164656 | A1 | 7/2010 | Chiu |
| 2010/0194489 | A1 | 8/2010 | Kearns et al. |
| 2011/0032021 | A1* | 2/2011 | Dianbo ................ H03K 17/063 |
| | | | 327/427 |
| 2013/0043962 | A1 | 2/2013 | Granger-Jones |
| 2014/0002214 | A1 | 1/2014 | Bawell et al. |
| 2014/0002282 | A1 | 1/2014 | Bawell et al. |
| 2014/0162580 | A1* | 6/2014 | Leung .................. H04B 17/21 |
| | | | 455/226.1 |
| 2015/0171828 | A1 | 6/2015 | Lam |
| 2015/0244051 | A1 | 8/2015 | Domino |
| 2015/0326204 | A1 | 11/2015 | Cho et al. |
| 2015/0326205 | A1 | 11/2015 | Cho et al. |
| 2015/0381139 | A1* | 12/2015 | Kiser ...................... H03H 7/24 |
| | | | 333/17.1 |
| 2016/0118959 | A1 | 4/2016 | Atesal et al. |
| 2016/0134259 | A1 | 5/2016 | Shrivastava et al. |
| 2017/0141802 | A1* | 5/2017 | Solomko ................ G01R 27/06 |
| 2017/0207769 | A1* | 7/2017 | Shrivastava ............ H03K 5/08 |
| 2017/0250723 | A1 | 8/2017 | Srirattana |

OTHER PUBLICATIONS 3.3 V, Upstream Cable Line Driver, AD8324, Analog Devices, Inc., 2016, <http://www.analog.com/media/en/technical-documentation/data-sheets/AD8324.pdf> [retrieved from the Internet on Dec. 15, 2017].

"ARA05050 Reverse Amplifier with Step Attenuator Data Sheet", Skyworks Solutions, Inc., 2016, <http://www.skyworksinc.com/uploads/documents/ARA05050_204227B.pdf> [retrieved from the Internet on Dec. 15, 2017].

"ARA2000 Address-Programmable Reverse Amplifier with Step Attenuator Data Sheet", Skyworks Solutions, Inc., 2016, <http://www.skyworksinc.com/uploads/documents/ARA2000_204228B.pdf> [retrieved from the Internet on Dec. 15, 2017].

"BGA3131 DOCSIS 3.1 upstream amplifier Product data sheet", NXP Semiconductors N.V., 2016, <https://www.nxp.com/docs/en/data-sheet/BGA3131.pdf> [retrieved from the Internet on Dec. 12, 2017].

"DOCSIS 3.0 Upstream Amplifier", Maxim, 2009, <https://media.digikey.com/pdf/Data%20Sheets/Maxim%20PDFs/MAX3518.pdf> [retrieved from the Internet on Dec. 15, 2017].

* cited by examiner

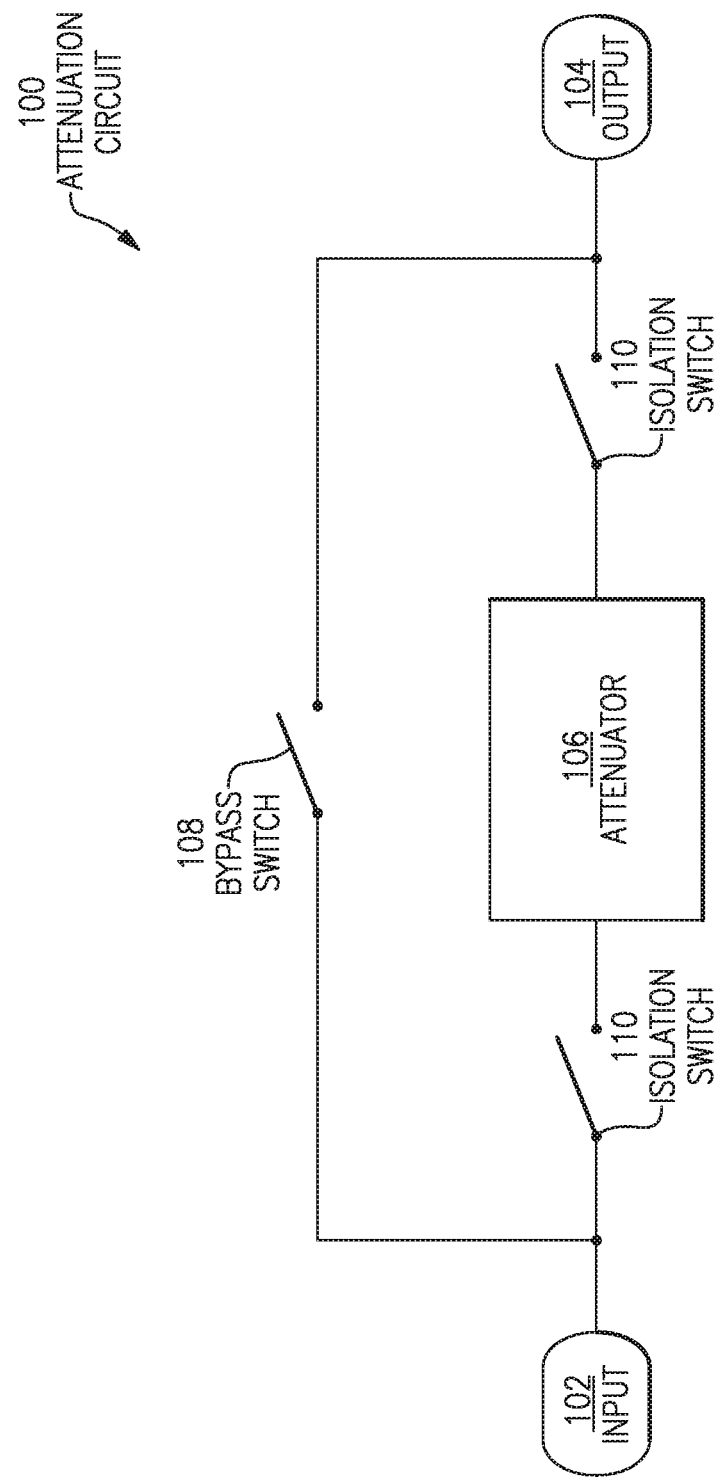

ATTENUATION CIRCUITS WITH LOW INSERTION LOSS, AND MODULES AND DEVICES USING SAME

CROSS REFERENCE TO RELATED APPLICATIONS

This application claims the benefit of an earlier filing date under 35 U.S.C. § 119(e) and claims the benefit of priority under PCT Article 8, as applicable, to U.S. Provisional Patent Application No. 62/300,134 filed on Feb. 26, 2016, and to U.S. Provisional Patent Application No. 62/365,065 filed on Jul. 21, 2016, each of which is incorporated herein by reference in its entirety for all purposes.

BACKGROUND

Attenuators generally reduce the power of a signal without substantially distorting a waveform of the signal. Attenuators may be fixed attenuators that provide a constant level of attenuation or multi-step attenuators that are configurable between multiple levels of attenuation. Multi-step attenuators are generally formed by cascading multiple attenuation stages and connecting a single bypass switch in parallel with each attenuation stage. The bypass switches may be controlled to bypass select attenuation stages to achieve a given level of attenuation.

SUMMARY OF THE INVENTION

Aspects and examples are directed to attenuation circuits with a low insertion loss. In particular, these attenuation circuits may present a lower insertion loss while operating in a bypass mode where the attenuation stage is bypassed to provide an output signal with a power level that is substantially similar to the power level of the input signal. The low insertion loss may be achieved by, for example, isolating the attenuation stage from the rest of the attenuation circuit during bypass mode with isolation switches. The isolation switches mitigate parasitic losses caused by the attenuation stage that would otherwise occur during bypass mode. In addition, various configurable attenuators are disclosed to combine the functionality of multiple attenuation stages into a single configurable attenuation stage to reduce the size of the attenuation circuit while still maintaining the multi-step functionality. Further, the configurable attenuators may be calibrated post manufacturing to compensate for any manufacturing variances.

According to one aspect, an attenuation circuit is provided. The attenuation circuit includes an input to receive an input signal, an output to provide an attenuated signal, an attenuator selectively coupled between the input and the output, the attenuator being configured to attenuate the input signal, a first isolation switch constructed and arranged to selectively isolate the attenuator from at least one of the input and the output when in a bypass mode, and a bypass switch coupled in parallel with the attenuator and the first isolation switch and constructed and arranged to selectively couple the input to the output when in the bypass mode.

In various embodiments, the attenuator may be a fixed attenuator, a multi-step attenuator, or a variable attenuator. The attenuator may have at least one fixed impedance and at least one switched impedance. A switched impedance may be a switch coupled in series with an impedance. The attenuator may be configurable among a plurality of levels of attenuation, including configurable among one or more of a 3 decibel, 6 decibel, and 9 decibel level of attenuation, or configurable among one or more of a 1 decibel, 2 decibel, and 3 decibel level of attenuation. The attenuator may be a T network attenuator, a pi network attenuator, and a bridged T network attenuator.

In certain embodiments, the first isolation switch includes a plurality of first transistors connected in series. The first isolation switch may further include at least one second transistor having a first terminal coupled between two of the plurality of first transistors and a second terminal coupled to ground.

In embodiments, the first isolation switch is positioned between the input and the attenuator and configured to selectively isolate the attenuator from the input. The attenuation circuit may include a second isolation switch positioned between the output and the attenuator and configured to selectively isolate the attenuator from the output. The bypass switch may have a first terminal coupled between the input and the first isolation switch and a second terminal coupled between the second isolation switch and the output.

In embodiments, the attenuator includes two first impedances coupled in series between the input and the output. The attenuator may include a plurality of second impedances each having a first terminal coupled between the two first impedances and a second terminal coupled to ground. One or more of the plurality of second impedances may be a fixed impedance and one or more of the plurality of second impedances may be a switched impedance. The attenuator may include a plurality of third impedances coupled in parallel between the input and the output. One or more of the plurality of third impedances may be a fixed impedance and one or more of the plurality of third impedances may be a switched impedance. The attenuator may include a fourth impedance having a first terminal coupled between the two first impedances and a second terminal coupled to ground. The fourth impedance may have a higher impedance value than any impedance value of the plurality of second impedances. The attenuator may include a fifth impedance coupled between the input and the output. The fifth impedance may have a higher impedance value than any impedance value of the plurality of third impedances.

According to another aspect, an electromagnetic coupler module is provided. The electromagnetic coupler module includes an input, an output, and a coupled port; an electromagnetic coupler connected between the input and the output, the electromagnetic coupler being configured to electromagnetically couple a portion of a signal traveling between the input and the output and to provide the coupled portion at the coupled port; an attenuator selectively connected to the coupled port, the attenuator being configured to selectively attenuate the coupled portion; a first isolation switch connected in series with the attenuator, the first isolation switch constructed to selectively isolate the attenuator from the coupled port when in a bypass mode; and a bypass switch connected in parallel with the attenuator and the first isolation switch and configured to convey the coupled portion between the coupled port and a node when in the bypass mode.

In embodiments, the attenuator may be a fixed attenuator, a multi-step attenuator, or a variable attenuator. The attenuator may have at least one fixed impedance and at least one switched impedance. A switched impedance may be a switch coupled in series with an impedance. The attenuator may be a multi-step attenuator that is configurable among a plurality of levels of attenuation, such as configurable between at least two of a 3 decibel, 6 decibel, and 9 decibel level of attenuation, or configurable between at least two of a 1 decibel, 2 decibel, and 3 decibel level of attenuation. The attenuator may be a T network attenuator, a pi network attenuator, or a bridged T network attenuator.

In certain embodiments, the first isolation switch includes a plurality of first transistors connected in series. The first isolation switch may further include at least one second transistor having a first terminal coupled between two of the plurality of first transistors and a second terminal coupled to ground.

In embodiments, the first isolation switch is connected between the coupler and the attenuator and configured to selectively isolate the attenuator from the coupler. A second isolation switch may be connected between the attenuator and the coupled port and configured to selectively isolate the attenuator from the coupled port. The bypass switch may be coupled in parallel with the first isolation switch, the attenuator, and the second isolation switch.

In various embodiments, the attenuator may include two first impedances coupled in series between the coupler and the coupled port. The attenuator may further include a plurality of second impedances each having a first terminal coupled between the two first impedances and a second terminal coupled to ground. One or more of the plurality of second impedances may be a fixed impedance and one or more of the plurality of second impedances may be a switched impedance. The attenuator may include a plurality of third impedances coupled in parallel between the coupler and the coupled port. One or more of the plurality of third impedances may be a fixed impedance and one or more of the plurality of third impedances may be a switched impedance. The attenuator may include a fourth impedance having a first terminal coupled between the two first impedances and a second terminal coupled to ground. The fourth impedance may have a higher impedance value than any impedance value of the plurality of second impedances. The attenuator may include a fifth impedance coupled between the input and the output. The fifth impedance may have a higher impedance value than any impedance value of the plurality of third impedances.

According to another aspect, an amplifier module having an input and an output is provided. The amplifier module includes an amplifier coupled between the input and the output, the amplifier being configured to amplify a signal received at the input; an attenuator coupled in series with the amplifier, the attenuator being configured to selectively attenuate the signal; a first isolation switch coupled in series with the attenuator and the amplifier, the first isolation switch constructed to selectively isolate the attenuator from the amplifier; and a bypass switch coupled in parallel with the attenuator and the first isolation switch and configured to convey the signal when the attenuator is isolated from the amplifier.

In embodiments, the attenuator may be a fixed attenuator, a multi-step attenuator, or a variable attenuator. The attenuator may have at least one fixed impedance and at least one switched impedance. A switched impedance may be a switch coupled in series with an impedance. The attenuator may be a multi-step attenuator that is configurable among a plurality of levels of attenuation, such as configurable between at least two of a 3 decibel, 6 decibel, and 9 decibel level of attenuation, or configurable between at least two of a 1 decibel, 2 decibel, and 3 decibel level of attenuation. The attenuator may be a T network attenuator, a pi network attenuator, or a bridged T network attenuator.

In certain embodiments, the first isolation switch includes a plurality of first transistors connected in series. The first isolation switch may further include at least one second transistor having a first terminal coupled between two of the plurality of first transistors and a second terminal coupled to ground.

In embodiments, the first isolation switch is coupled between the amplifier and the attenuator and configured to selectively isolate the attenuator from the amplifier. A second isolation switch may be coupled between the attenuator and one of the input and the output and configured to selectively isolate the attenuator from the one of the input and the output. The bypass switch may be coupled in parallel with the first isolation switch, the attenuator, and the second isolation switch.

In various embodiments, the attenuator may include two first impedances coupled in series. The attenuator may further include a plurality of second impedances each having a first terminal coupled between the two first impedances and a second terminal coupled to ground. One or more of the plurality of second impedances may be a fixed impedance and one or more of the plurality of second impedances may be a switched impedance. The attenuator may include a plurality of third impedances coupled in parallel with the two first impedances. One or more of the plurality of third impedances may be a fixed impedance and one or more of the plurality of third impedances may be a switched impedance. The attenuator may include a fourth impedance having a first terminal coupled between the two first impedances and a second terminal coupled to ground. The fourth impedance may have a higher impedance value than any impedance value of the plurality of second impedances. The attenuator may include a fifth impedance coupled between the input and the output. The fifth impedance may have a higher impedance value than any impedance value of the plurality of third impedances.

According to another aspect, a wireless device is provided. The wireless device includes a transceiver configured to produce a transmit signal and to receive a receive signal and an attenuation circuit configured to selectively attenuate an input signal, the input signal being at least one of the transmit signal, the receive signal, and a derived signal derived from at least one of the transmit signal and the receive signal, the attenuation circuit including an input to receive the input signal, an output to provide an attenuated signal, an attenuator selectively coupled between the input and the output, a first isolation switch constructed and arranged to selectively isolate the attenuator from at least one of the input and the output when in a bypass mode, and a bypass switch coupled in parallel with the attenuator and the first isolation switch and constructed and arranged to selectively couple the input to the output in the bypass mode.

Some embodiments include an antenna coupled to the transceiver and configured to transmit the transmit signal and to receive the receive signal.

In embodiments, the attenuator may be a fixed attenuator, a multi-step attenuator, or a variable attenuator. The attenuator may have at least one fixed impedance and at least one switched impedance. A switched impedance may be a switch coupled in series with an impedance. The attenuator may be a multi-step attenuator that is configurable among a plurality of levels of attenuation, such as configurable between at least two of a 3 decibel, 6 decibel, and 9 decibel level of attenuation, or configurable between at least two of a 1 decibel, 2 decibel, and 3 decibel level of attenuation. The attenuator may be a T network attenuator, a pi network attenuator, or a bridged T network attenuator.

In certain embodiments, the first isolation switch includes a plurality of first transistors connected in series. The first isolation switch may further include at least one second transistor having a first terminal coupled between two of the plurality of first transistors and a second terminal coupled to ground.

In embodiments, the first isolation switch is positioned between the input and the attenuator and configured to selectively isolate the attenuator from the input. The attenuation circuit may include a second isolation switch positioned between the output and the attenuator and configured to selectively isolate the attenuator from the output. The bypass switch may have a first terminal coupled between the input and the first isolation switch and a second terminal coupled between the second isolation switch and the output.

In embodiments, the attenuator includes two first impedances coupled in series between the input and the output. The attenuator may include a plurality of second impedances each having a first terminal coupled between the two first impedances and a second terminal coupled to ground. One or more of the plurality of second impedances may be a fixed impedance and one or more of the plurality of second impedances may be a switched impedance. The attenuator may include a plurality of third impedances coupled in parallel between the input and the output. One or more of the plurality of third impedances may be a fixed impedance and one or more of the plurality of third impedances may be a switched impedance. The attenuator may include a fourth impedance having a first terminal coupled between the two first impedances and a second terminal coupled to ground. The fourth impedance may have a higher impedance value than any impedance value of the plurality of second impedances. The attenuator may include a fifth impedance coupled between the input and the output. The fifth impedance may have a higher impedance value than any impedance value of the plurality of third impedances.

In various embodiments, the wireless device may include one or more of a sensor, a memory, a baseband sub-system, a user interface, an antenna switch module, a power amplifier, an electromagnetic coupler, and a battery.

According to some embodiments, the wireless device includes a power amplifier, the output of the attenuation circuit coupled to an input of the power amplifier and configured to selectively provide an attenuated signal to the power amplifier, the power amplifier configured to amplify the attenuated signal.

According to some embodiments, the wireless device includes a power amplifier configured to amplify at least one of the transmit signal, the receive signal, and the derived signal to produce an amplified signal, and the attenuation circuit configured to selectively attenuate the amplified signal.

According to some embodiments, the wireless device includes an electromagnetic coupler configured to couple a portion of one of the transmit signal and the receive signal to provide the derived signal, and the attenuation circuit configured to selectively attenuate the derived signal to provide an attenuated signal. A sensor may be coupled to the output of the attenuation circuit and configured to sense a parameter of the attenuated signal.

Still other aspects, examples, and advantages of these exemplary aspects and examples are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 1 is a schematic equivalent circuit diagram of an example attenuation circuit;

DETAILED DESCRIPTION

Figure 2A:
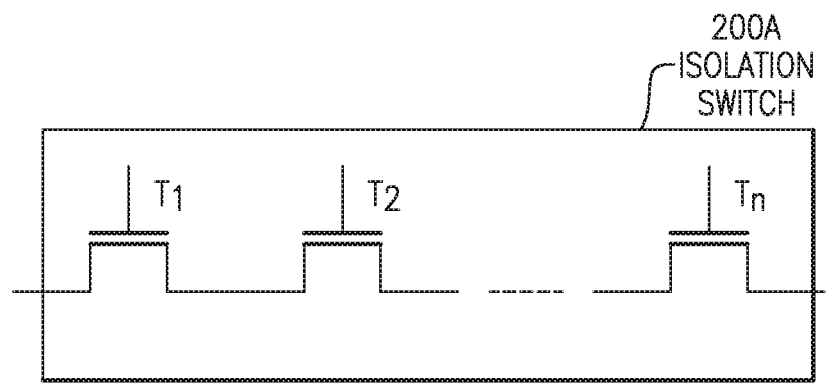
FIGS. 2A-2B are schematic equivalent circuit diagrams of example isolation switches.

Aspects of the present disclosure are directed to attenuation circuits. Attenuation circuits as disclosed herein may provide, for example, a lower insertion loss while operating in a bypass mode. The lower insertion loss may be achieved by adding isolation switches between the attenuator and the ports of the attenuation circuit. The isolation switches may be opened when the attenuation circuit is operating in a bypass mode to isolate the attenuator from the remainder of the attenuation circuit and closed when the attenuation circuit is operating in an attenuation mode.

In addition, the attenuation circuits disclosed herein include, in some examples, a multi-step attenuator that is capable of providing multiple levels of attenuation in a single stage. The configurability may be achieved by, for example, switchably connecting one or more impedances in parallel with a fixed impedance to alter the equivalent impedance between two circuit nodes. Thereby, the equivalent resistance of various sections of the attenuator may be altered resulting in different levels of attenuation. Further, the multi-step attenuator may include additional switched impedances to correct for any deviations from the desired attenuation levels introduced by, for example, manufacturing variation.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

FIG. 1 illustrates an example attenuation circuit 100 constructed to receive an input signal and provide an output signal. As illustrated in FIG. 1, the attenuation circuit 100 receives the input signal at an input 102 and provides the output signal at an output 104. It is appreciated that the attenuation circuit 100 may be symmetrical and, thereby, receive the input signal at either port and still function in the same manner.

The attenuation circuit 100 includes an attenuator 106 coupled in parallel with a bypass switch 108. The attenuation circuit 100 may operate in attenuation mode by opening the bypass switch 108 to send the input signal through the attenuator 106 to reduce a power level of the input signal. The bypass switch 108 may be closed in a bypass mode to bypass the attenuator and provide an output signal that is substantially similar to the input signal. It is appreciated that the output signal is generally still slightly attenuated in the bypass mode of operation due to, for example, losses through the bypass switch 108 and/or parasitic losses from the attenuator 106. In the example illustrated in FIG. 1, these insertion losses are mitigated by the introduction of one or more isolation switches 110 between the attenuator 106 and the input 102 and/or between the attenuator 106 and the output 104. The isolation switches 110 isolate the attenuator 106 from the remainder of the attenuation circuit 100 and, thereby, reduce parasitic losses caused by the attenuator 106 when operating in the bypass mode.

Figure 2B:
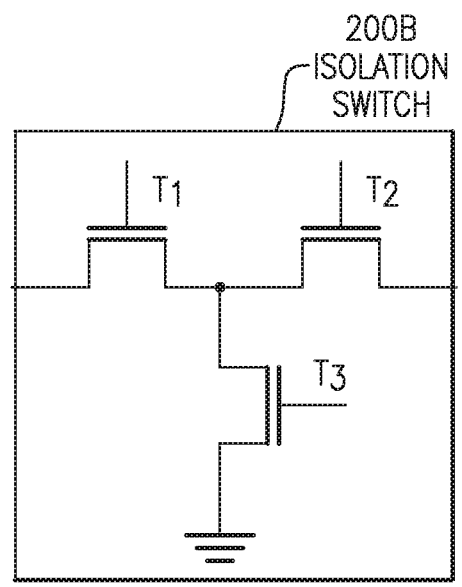

The isolation switches 110 may be constructed in a variety of manners depending upon the particular implementation. FIGS. 2A and 2B illustrate two example constructions of the isolation switch 110. In FIG. 2A, the isolation switch 200A is constructed by connecting a plurality of transistors $T_1$-$T_a$ in series. A plurality of series-connected transistors, as in the isolation switch 200A, may provide additional isolation than may be provided over fewer transistors or by only one transistor. Additionally, a higher number of transistors in series may accommodate a higher input power as the input voltage level is distributed across more transistors, reducing the possibility of voltage breakdown in any of the transistors. The isolation switch 200B in FIG. 2B introduces a shunt transistor $T_3$ between the transistors $T_1$ and $T_2$ that are connected in series. In bypass mode, the shunt transistor $T_3$ is closed (i.e., turned on) while the series transistors $T_1$ and $T_2$ are open (i.e., turned off), and the shunt transistor $T_3$ in the closed state further increases isolation by grounding the otherwise free floating electrical connection between the transistors $T_1$ and $T_2$. In the attenuation mode, series transistors $T_1$ and $T_2$ are turned on, and the shunt transistor $T_3$ is turned off. It is appreciated that the isolation switch 110 may be formed from combinations of the example isolation switch 200A and the example isolation switch 200B, with more or fewer series transistors and additional shunt transistors, as well as other configurations may be employed to form the isolation switch 110 depending upon the particular implementation. Further, the transistors may be any type of transistor including, for example, a field-effect transistor (FET) or a bipolar junction transistor (BJT).

The introduction of the isolation switches 110 into the attenuation circuit 100 may further attenuate the input signal beyond the attenuation applied by the attenuator 106 while in attenuation mode. As described in more detail below, the attenuation provided by the attenuator 106 may be designed to be slightly lower than the total desired attenuation to compensate for the additional attenuation introduced by the isolation switches 110. For example, the isolation switches 110 may introduce an additional 0.5 decibels (dB) of attenuation and the attenuator 106 may be constructed to provide 2.5 dB of attenuation to achieve a desired total attenuation of 3 dB.

As described above, the attenuation circuit 100 may include an attenuator 106 to attenuate the input signal in the attenuation mode of operation. Various types of attenuators may be employed depending upon the particular implementation. For example, the attenuator 106 may be a fixed attenuator that provides a single constant level of attenuation, a multi-step attenuator that is configurable between a pre-defined set of attenuation levels, or a variable attenuator that is configurable within a continuous range of attenuation levels.

Figure 3C:
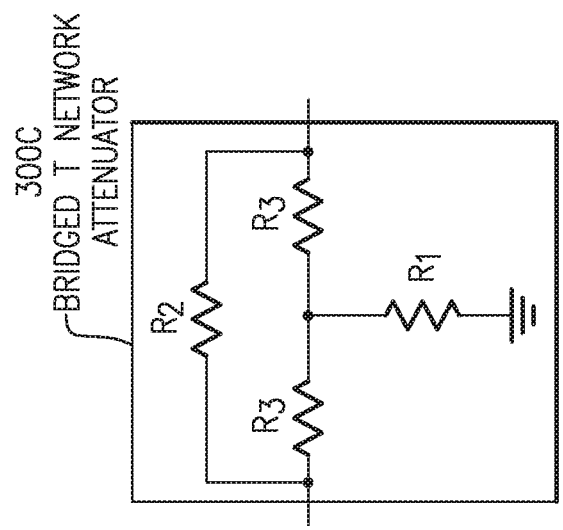
FIGS. 3A-3C are schematic equivalent circuit diagrams of example attenuators.
Figure 3B:
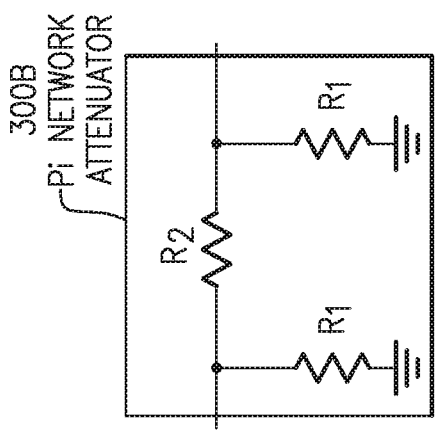
Figure 3A:
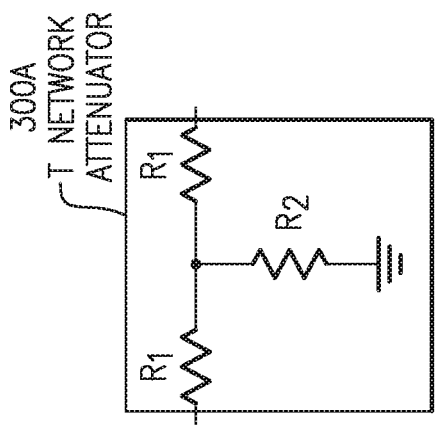

FIGS. 3A-3C illustrate three different types of fixed attenuators that may be suitable to employ as attenuator 106. FIG. 3A illustrates an example T network attenuator 300A. The T network attenuator 300A includes two impedances $R_1$ connected in series and another impedance $R_2$ with a first terminal coupled to ground and a second terminal coupled between the two series connected impedances $R_1$. The values for the impedances $R_1$ and $R_2$ may be determined based on the relationships illustrated in equation (1) below.

$$R_1 = Z_0 * \left( \frac{\sqrt{10^{\frac{A}{10}}} - 1}{\sqrt{10^{\frac{A}{10}}} + 1} \right) \bigg\| R_2 = Z_0 * \frac{2*\sqrt{10^{\frac{A}{10}}}}{\left(10^{\frac{A}{10}} - 1\right)} \quad (1)$$

In equation (1), the value A is the desired attenuation level in dB and $Z_0$ is the characteristic impedance of the attenuator.

FIG. 3B illustrates an example pi network attenuator 300B. The pi network attenuator 300B includes an impedance $R_2$ connected between the input and the output. The pi network attenuator 300B also includes an impedance $R_1$ connected between the input and ground in addition to another impedance $R_1$ connected between the output and ground. The values for the impedances $R_1$ and $R_2$ may be determined based on the relationships illustrated in equation (2) below given a desired attenuation level A in dB and a characteristic impedance $Z_0$.

$$R_1 = Z_0 * \left( \frac{\sqrt{10^{\frac{A}{10}}} + 1}{\sqrt{10^{\frac{A}{10}}} - 1} \right) \bigg\| R_2 = Z_0 * \frac{\left(10^{\frac{A}{10}} - 1\right)}{2*\sqrt{10^{\frac{A}{10}}}} \quad (2)$$

FIG. 3C illustrates an example bridged T network attenuator 300C. The bridged T network attenuator 300C includes two impedances $R_3$ connected in series between the input and the output in addition to an impedance $R_1$ with a first terminal coupled to ground and a second terminal coupled between the two series connected impedances $R_3$. The bridged T network attenuator 300C also includes an impedance $R_2$ coupled between the input and the output. The values for the impedances $R_1$, $R_2$, and $R_3$ may be determined based on the relationships illustrated in equation (3) below given a desired attenuation level A in dB and a desired characteristic impedance $Z_0$.

$$R_1 = \frac{Z_0}{\sqrt{10^{\frac{A}{10}} - 1}} \mid R_2 = Z_0 * \left(\sqrt{10^{\frac{A}{10}}} - 1\right) \mid R_3 = Z_0 \quad (3)$$

In some examples, the attenuator 106 is a multi-step attenuator. In these examples, the attenuator 106 may be configurable between multiple discrete attenuation levels. The configurability may be achieved by, for example, changing the impedance values of the impedances $R_1$ and/or $R_2$ in the T, pi, and bridged T networks described above. Table 1 illustrates example values of $R_1$ and $R_2$ to achieve various attenuation steps in bridged T network attenuator 300C described above using equation (3) above assuming a bypass switch loss of 0.2 dB and an isolation switch loss of 0.5 dB.

TABLE 1

| Total Desired Attenuation Step | Attenuator Design Attenuation Step | Calculated $R_1$ Values | Calculated $R_2$ Values |
|---|---|---|---|
| 3 dB | 2.7 dB | 137.14 Ω | 18.23 Ω |
| 6 dB | 5.7 dB | 53.91 Ω | 46.38 Ω |
| 9 dB | 8.7 dB | 29.02 Ω | 86.14 Ω |

As illustrated in Table 1, the attenuator 106 may be designed for a slightly different amount of attenuation than the total desired attenuation to account for the attenuation introduced by other components (e.g., isolation switches 110).

The impedances $R_1$ and $R_2$ may be varied by a variety of methods depending upon the particular implementation. For example, multiple switched impedances connected in parallel may replace the single impedances $R_1$ or $R_2$. In this example, the equivalent impedance of the parallel connected switched impedances can be changed by selectively connecting or disconnecting some of the switched impedances. This approach may be advantageous because it avoids the use of small impedance values, which generally are more difficult to manufacture with tight tolerances and/or may require more space. For example, the three impedance values of $R_2$ illustrated in Table 1 (i.e., 18.23 Ω, 46.38Ω, and 86.14Ω) may be achieved without a small 18.23Ω impedance. Rather, the three impedance values of $R_2$ may be achieved with a fixed impedance of 86.14Ω and two switched impedances of 100.48Ω and 30.04Ω that are connected in parallel with the fixed impedance. The 86.14Ω impedance for the 9 dB step may be achieved by disconnecting both of the switched impedances leaving only the 86.14Ω fixed impedance. The 46.38Ω impedance for the 6 dB step may be achieved by connecting the 100.48Ω impedance in parallel with the 86.14Ω fixed impedance. In addition, the 18.23Ω impedance for the 3 dB step may be achieved by connecting both the 100.48Ω impedance and the 30.04Ω impedance in parallel with the 86.14Ω fixed impedance. As illustrated, by connecting additional impedances in parallel to form smaller equivalent impedances, the smallest impedance employed in the circuit configuration (e.g., 30.04Ω) is much larger than the smallest impedance of $R_2$ (e.g., 18.23Ω) to achieve the desired attenuation levels.

Figure 4:
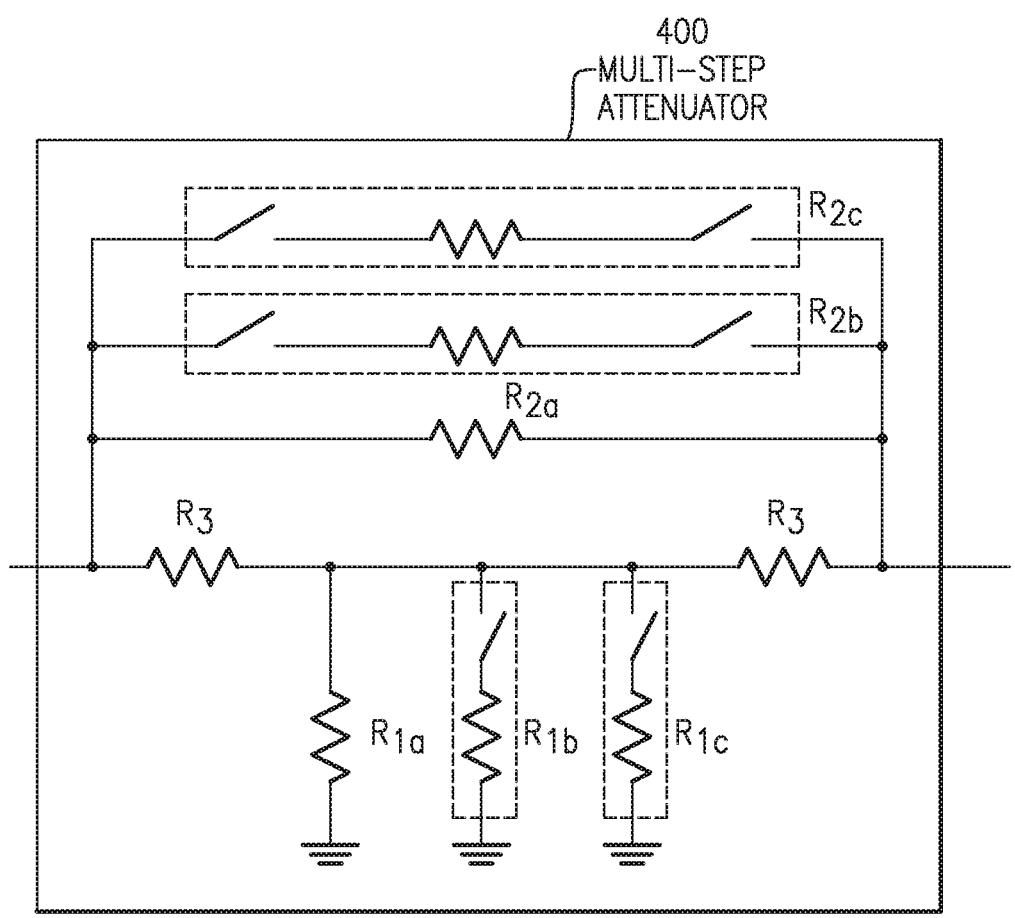
FIG. 4 is a schematic equivalent circuit diagram of an example multi-step attenuator.

FIG. 4 illustrates an example multi-step attenuator 400 including multiple switched impedances to change the equivalent impedance values for $R_1$ and $R_2$ to achieve various attenuation steps. As illustrated, the multi-step attenuator 400 is a bridged T network attenuator with the impedance $R_1$ being replaced with a fixed impedance $R_{1a}$ and two switched impedances $R_{1b}$ and $R_{1c}$ in addition to the impedance $R_2$ being replaced with a fixed impedance $R_{2a}$ and two switched impedances $R_{2b}$ and $R_{2c}$. It is appreciated that the multi-step attenuator 400 may have any number of switched impedances connected in parallel with the fixed impedance depending upon the particular implementation. In addition, the multi-step attenuator 400 may be implemented using configurations other than the bridged T network. For example, the fixed T network attenuator 300A and the fixed pi network attenuator 300B may each be converted into multi-step attenuators by replacing each instance of the impedances $R_1$ and $R_2$ with a fixed impedance connected in parallel with one or more switched impedances.

The switched impedances $R_{1b}$, $R_{1c}$, $R_{2b}$, and $R_{2c}$ include one or more switches coupled in series with an impedance. The switches may be transistors including, for example, FETs and BJTs. As illustrated, the switched impedances $R_{1b}$ and $R_{1c}$ each include an impedance coupled in series with a single switch and the switched impedances $R_{2b}$ and $R_{2c}$ each include an impedance coupled between two switches. It is appreciated that the specific configuration of the switched impedances in FIG. 4 is for illustration only and other configurations may be employed. For example, the switched impedances $R_{2b}$ and $R_{2c}$ may each only include a single switch coupled in series with an impedance.

Figure 5A:
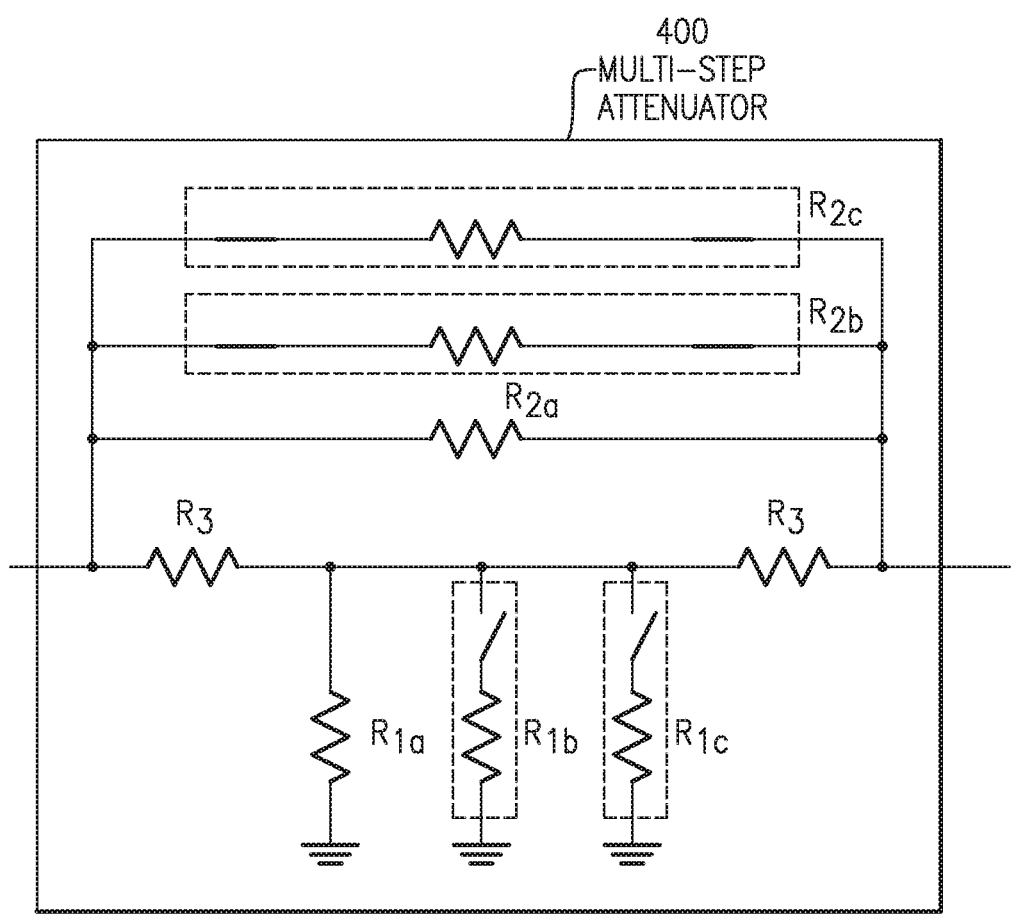
FIGS. 5A-5C are schematic equivalent circuit diagrams of the example multi-step attenuator of FIG. 4 in various states.
Figure 5B:
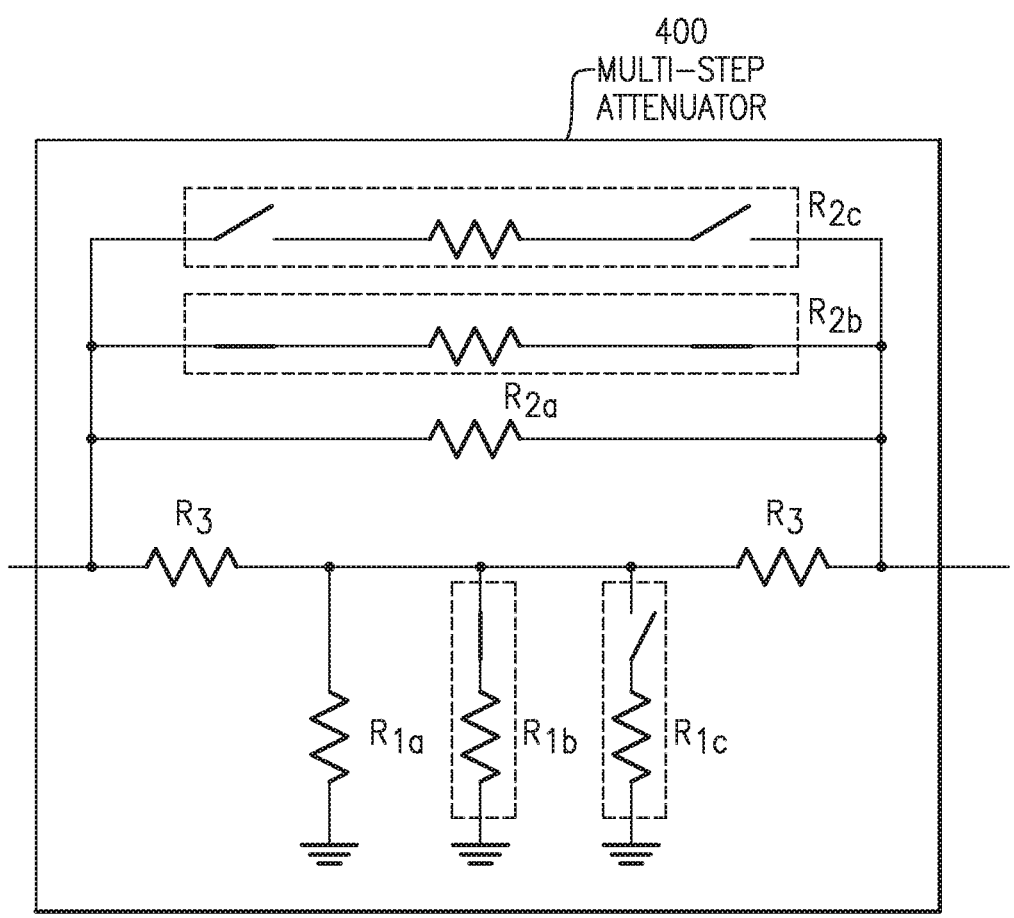
Figure 5C:
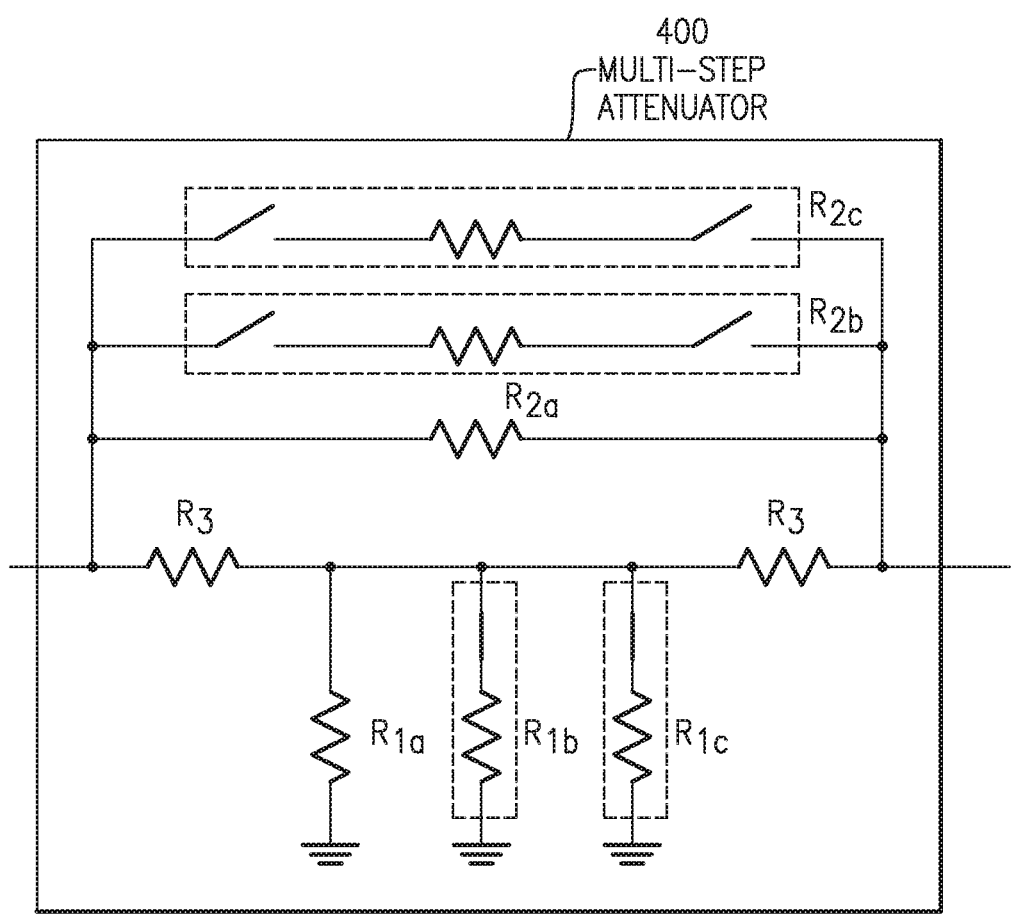

The multi-step attenuator 400 may achieve various attenuation levels by connecting and disconnecting the switched impedances $R_{1b}$, $R_{1c}$, $R_{2b}$, and $R_{2c}$. FIGS. 5A-5C illustrate the multi-step attenuator 400 with the switched impedances $R_{1b}$, $R_{1c}$, $R_{2b}$, and $R_{2c}$ in various states to achieve three different attenuation levels. An example set of impedance values for $R_{1a}$-$R_{1c}$ and $R_{2a}$-$R_{2c}$ is illustrated in Table 2 below to achieve the 3 dB, 6 dB, and 9 dB levels of attenuation shown in Table 1 above. The 3 dB, 6 dB, and 9 dB levels of attenuation correspond to the configurations in FIGS. 5A, 5B, and 5C, respectively.

TABLE 2

| Impedance | Resistance Value |
|---|---|
| $R_{1a}$ | 137.14 Ω |
| $R_{1b}$ | 88.83 Ω |
| $R_{1c}$ | 62.86 Ω |
| $R_{2a}$ | 86.14 Ω |
| $R_{2b}$ | 100.48 Ω |
| $R_{2c}$ | 30.04 Ω |

FIG. 5A shows the multi-step attenuator 400 with switched impedances $R_{1b}$ and $R_{1c}$ both disconnected and the switched impedances $R_{2b}$ and $R_{2c}$ both connected. By connecting the switched impedances $R_{2b}$ and $R_{2c}$ in parallel with the fixed impedance $R_{2a}$, the equivalent impedance of $R_2$ is lowered. Disconnecting the impedances $R_{1b}$ and $R_{1c}$ makes the equivalent impedance of $R_1$ equal to the fixed impedance $R_{1a}$. Given the impedance values illustrated in Table 2, this configuration yields a 137.14Ω impedance for $R_1$ and a 18.23Ω impedance for $R_2$ suitable for the 3 dB attenuation level illustrated in Table 1.

FIG. 5B shows the multi-step attenuator 400 with switched impedance $R_{1b}$ connected and switched impedance $R_{2c}$ disconnected relative to the configuration in FIG. 5A. Thereby, the equivalent impedance of $R_1$ is decreased by adding $R_{1b}$ in parallel with $R_{1a}$. In addition, the equivalent impedance of $R_2$ is increased by disconnecting $R_{2c}$. Given the impedance values illustrated in Table 2, this configuration yields a 53.91Ω impedance for $R_1$ and a 46.38Ω impedance for $R_2$ suitable for the 6 dB attenuation level illustrated in Table 1.

FIG. 5C shows the multi-step attenuator 400 with switched impedance $R_{1c}$ connected and switched impedance $R_{2b}$ disconnected relative to the configuration in FIG. 5B. Thereby, the equivalent impedance of $R_1$ is further decreased by adding $R_{1c}$ in parallel with $R_{1a}$ and $R_{1b}$. In addition, the equivalent impedance of $R_2$ is further increased by disconnecting $R_{2b}$. Given the impedance values illustrated in Table 2, this configuration yields a 29.02Ω impedance for $R_1$ and a 86.14Ω impedance for $R_2$ suitable for the 9 dB attenuation level illustrated in Table 1.

It should be appreciated that although the multi-step attenuator 400 of FIG. 4 has been described with respect to three attenuation levels of 3 dB, 6 dB, and 9 dB, other levels of attenuation and a different number of levels may alternatively be provided, as aspects of the present disclosure are not limited to any specific set of attenuation levels, nor limited to any specific number of levels or steps of attenuation.

Figure 6:
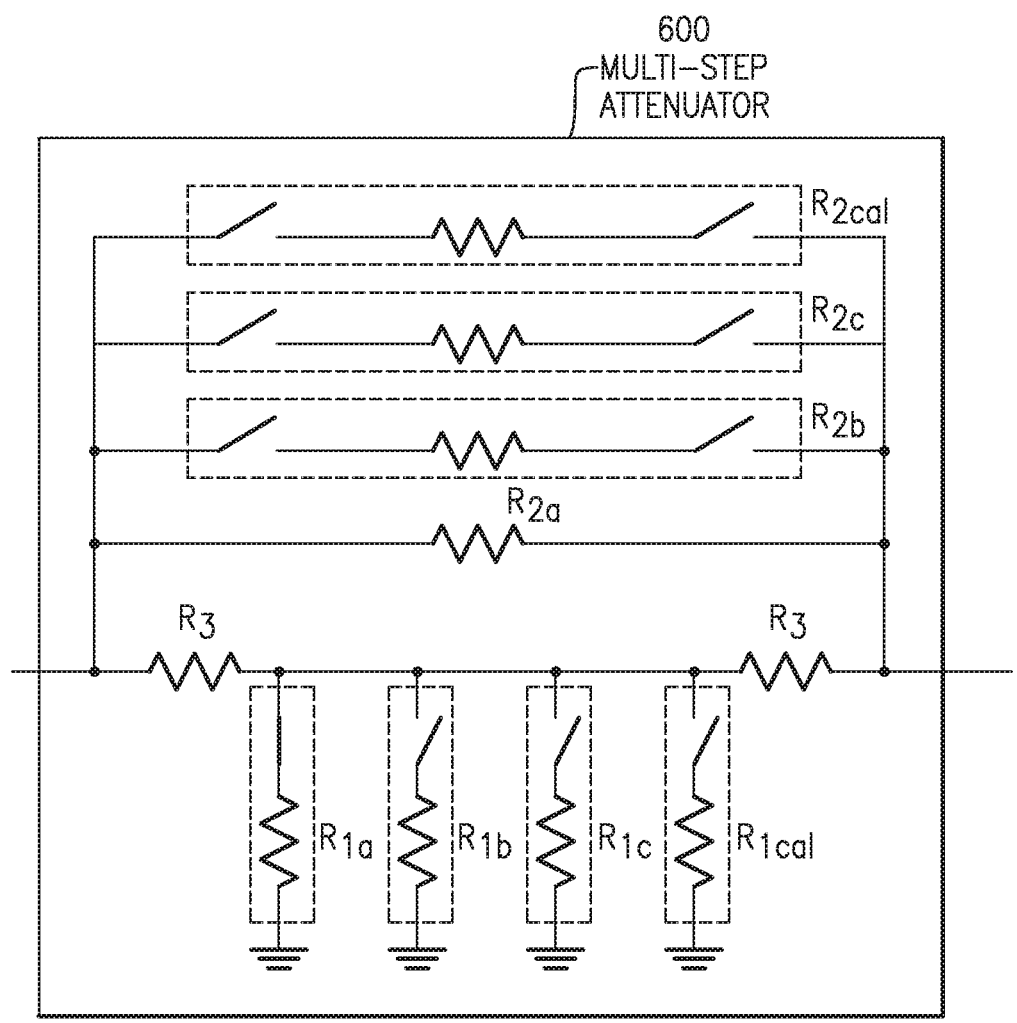
FIG. 6 is a schematic equivalent circuit diagram of an example multi-step attenuator with tuning capability.

In some examples, the attenuator 106 may be constructed to be calibrated to reduce the impact of any manufacturing variations. For example, the precise impedance values of any of the impedances $R_{1a}$-$R_{1c}$ and $R_{2a}$-$R_{2c}$ may vary slightly from the desired values due to manufacturing variances. These minor deviations may be accounted for by the further addition of one or more switched calibration impedances as illustrated by the multi-step attenuator 600 in FIG. 6. The multi-step attenuator 600 adds two calibration impedances $R_{1cal}$ and $R_{2cal}$ relative to the multi-step attenuator 400 in FIG. 4. The calibration impedance $R_{1cal}$ may have an impedance value that is greater than any of impedances $R_{1a}$-$R_{1c}$. Similarly, the calibration impedance $R_{2cal}$ may have an impedance value that is greater than any of impedances $R_{2a}$-$R_{2c}$. Given the example impedances values for $R_{1a}$-$R_{1c}$ and $R_{2a}$-$R_{2c}$ in Table 2, the impedance of $R_{1cal}$ may be 1,500Ω and the impedance of $R_{2cal}$ may be 200Ω. By employing larger impedance values for $R_{1cal}$ and $R_{2cal}$, the adjustment to the total impedances $R_1$ and $R_2$ is relatively small when either $R_{1cal}$ or $R_{2cal}$ is connected resulting in minor adjustments to the total attenuation at any given step (e.g., 0.1 dB of change). Thereby, small variations in the impedance of a given impedance value can be mitigated by switching the calibration impedances $R_{1cal}$ and $R_{2cal}$.

Thus, aspects and examples provide various circuit designs to reduce insertion losses of attenuation circuits operating in a bypass mode by, for example, incorporating isolation switches between the attenuator and input/output ports of the attenuation circuits. In addition, example multi-step attenuators have been provided that incorporate the functionality of multiple attenuation stages into a single configurable attenuation stage and account for manufacturing variances.

Figure 7:
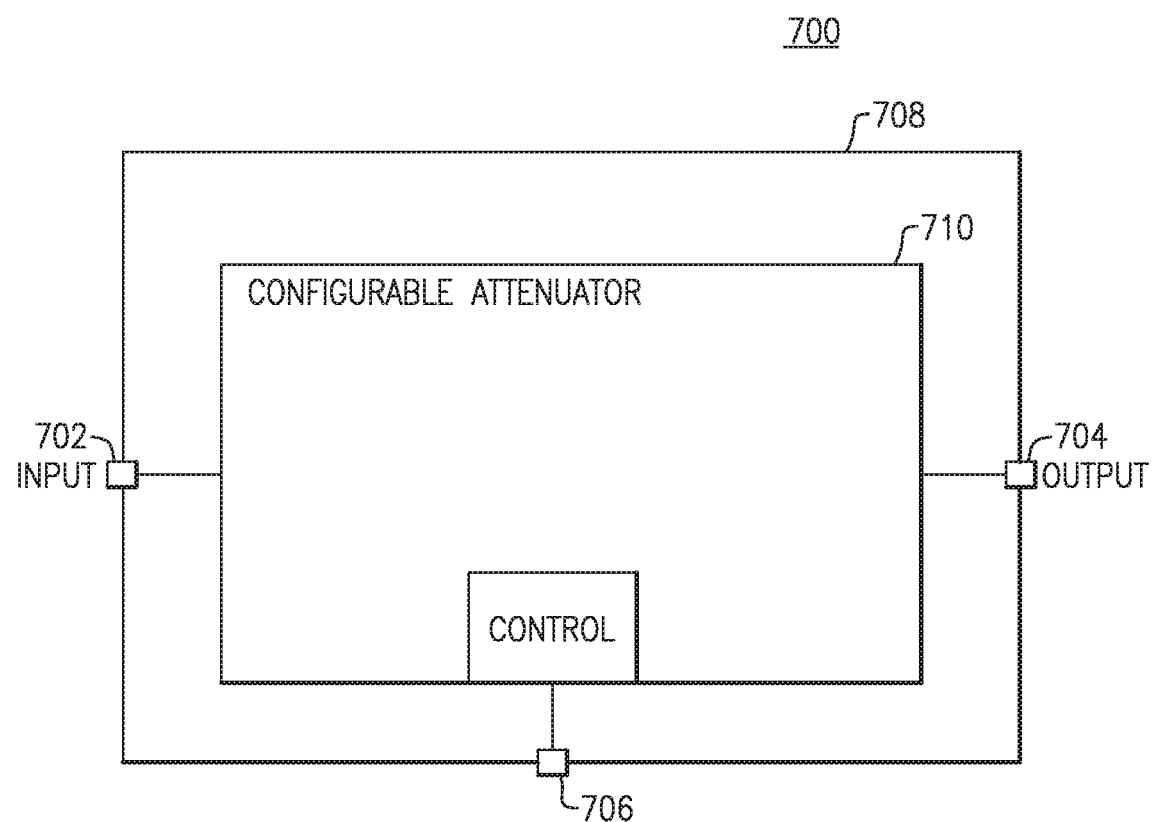
FIG. 7 is a block diagram of an example module including an attenuation circuit.

According to other aspects, any of the attenuators disclosed herein, isolable and configurable, may be incorporated into various packages, modules, or devices to create a commercial production unit. FIGS. 7-9 illustrate examples of modules that can include any of the configurable attenuators discussed herein. These example modules can include any combination of features associated with the attenuators disclosed herein, including isolation, step values, and compensation for manufacturing variations.

FIG. 7 is a block diagram of one example of a module 700 that includes an embodiment of the attenuators disclosed herein, e.g., attenuator 100, 400, 600, as attenuator 710. The module 700 may include a substrate 708 and may include one or more dies, upon which circuitry of attenuator 710 and other circuitry are implemented. In some embodiments, the module 700 can include one or more packaging structures to provide protection and facilitate easier handling of the module 700. Such a packaging structure can include an overmold formed over a packaging substrate and dimensioned to substantially encapsulate the various dies and components thereon. The module 700 further includes connectivity from the attenuator 710 to the exterior of the module 700 to provide signal and control interconnections, such as input 702, output 704, and control interface 706. The connections 702, 704, and 706 may include contacts, wirebonds, solder bumps, balls, lands, pins, sockets, etc. The control interface 706 provides an interface to communicate to or control the configurable nature of the attenuator 710, for example, isolation settings, attenuation step values, and compensation, as discussed herein. Any of the aspects and embodiments of the attenuators discussed herein may allow for bi-directional operation, such that, for example, the input 702 and the output 704 might be interchangeable in any given module.

Figure 8A:
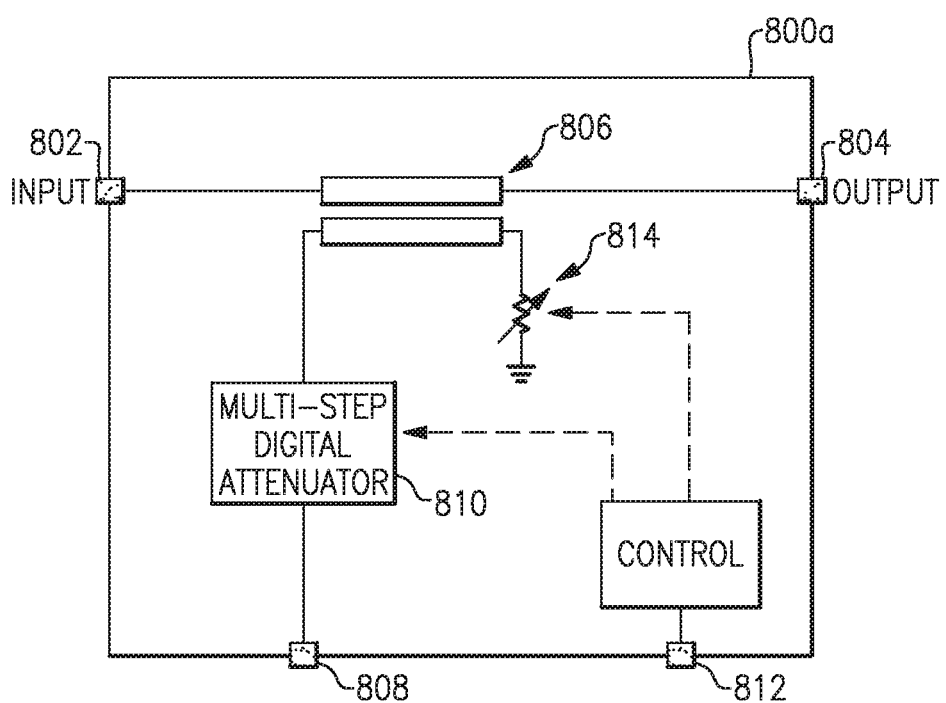
FIGS. 8A-8F are block diagrams of example coupler modules including an attenuation circuit.

FIG. 8A is a block diagram of an example of a coupler module 800a that includes an attenuator 810 configured to attenuate a signal from a coupler 806. Similar to module 700 above, the module 800a may include packaging and connectivity to external devices. In the example module 800a of FIG. 8A, shown are connections for the input 802, output 804, coupled output 808, and a control interface 812. The coupler 806 may provide a coupled portion of an input signal received at the input 802 and provide it to the attenuator 810, which attenuates the coupled signal in accordance with its current configuration. Module 800a allows a configurable coupling factor, at least because the attenuator 810 allows for various attenuation values of the coupled output signal.

Figure 8B:
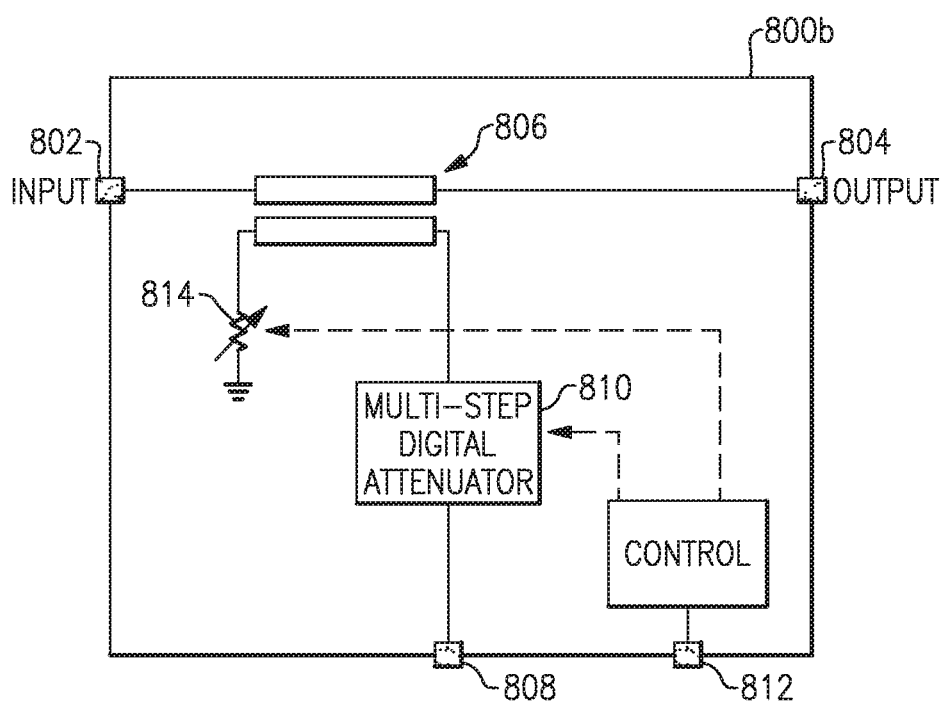

FIG. 8B is a block diagram of another example of a coupler module 800b that includes an attenuator 810 configured to attenuate a coupled signal. In this example, the coupler 806 is configured for reverse operation, providing a coupled portion of an input signal received at the input 802 to the attenuator 810, which attenuates the coupled signal in accordance with its current configuration.

Figure 8C:
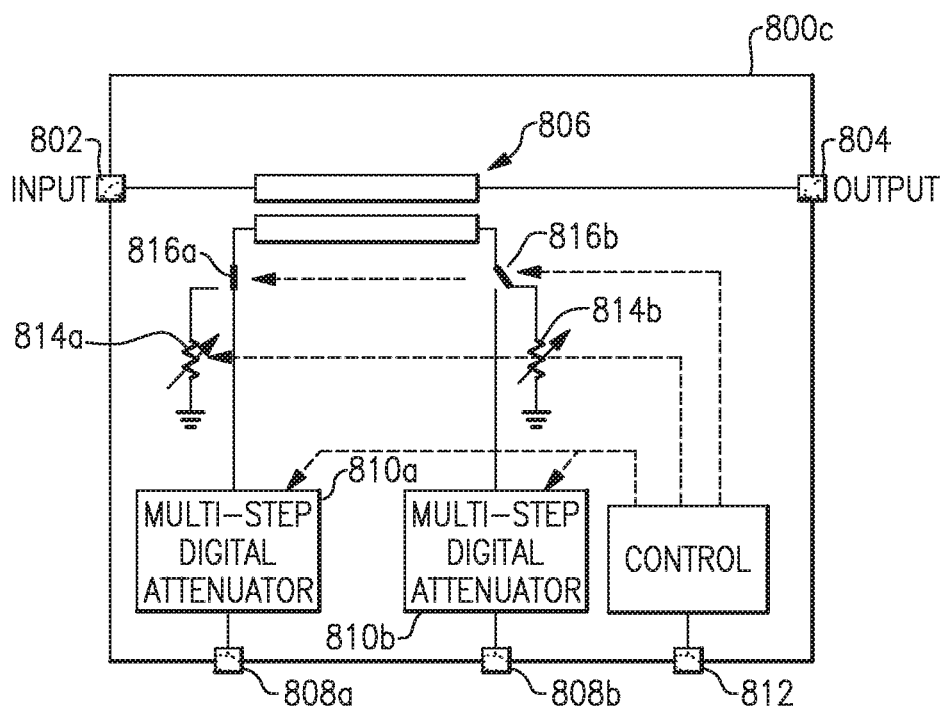

FIG. 8C is a block diagram of another example of a coupler module 800c. In this example, the coupler 806 is configured to allow bi-directional switched coupling. When in the configuration shown, the module 800c provides a forward coupled signal (coupled from a forward signal received at the input 802) to an attenuator 810a, by switching a forward coupled port to the attenuator 810a at switch 816a and by switching an isolation port to a termination impedance 814b at switch 816b. A reverse coupled signal (from a reverse signal received at the output 804) may be provided to another attenuator 810b by alternating the configuration of the switches 816a, 816b. As shown, the termination impedances 814a and 814b may be variable or adjustable impedances. The coupler module 800c, for example, has two attenuated coupled outputs 808a and 808b for forward and reverse coupled signals, respectively.

Figure 8D:
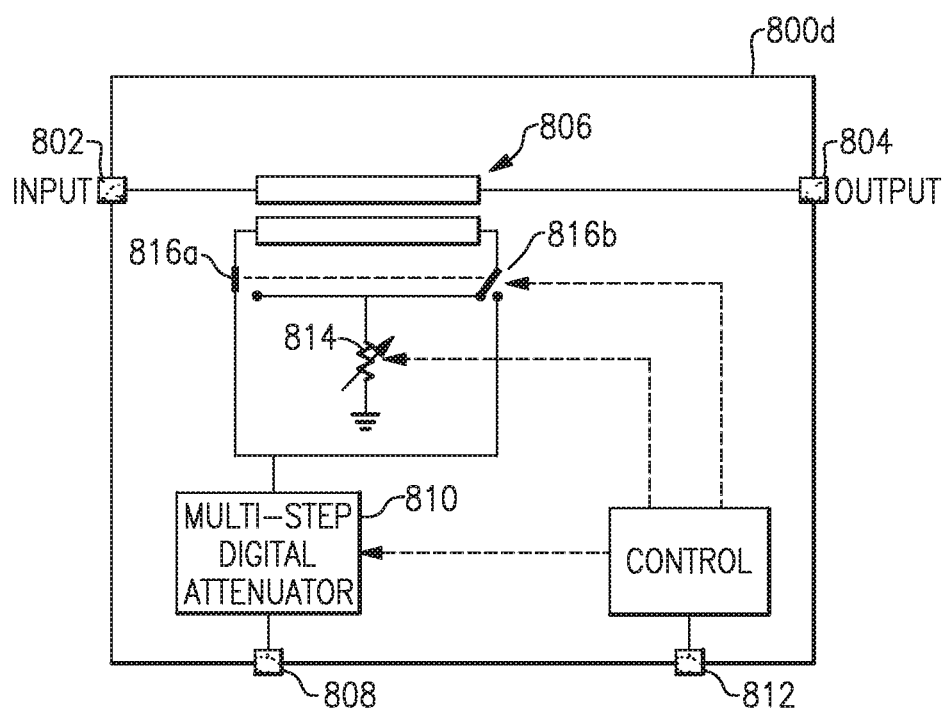

FIG. 8D is a block diagram of another example of a coupler module 800d. In this example, the coupler 806 is configured to allow bi-directional switched coupling similar to FIG. 8C with only a single attenuator 810 and a single termination impedance 814. The coupler 806 of FIG. 8D is selectively switchable to couple a forward signal or a reverse signal, and the attenuator 810 attenuates whichever coupled signal is provided by the coupler 806. In particular, the coupler 806 may provide a coupled portion of a signal received at the input 802 or a signal received at the output 804.

Figure 8E:
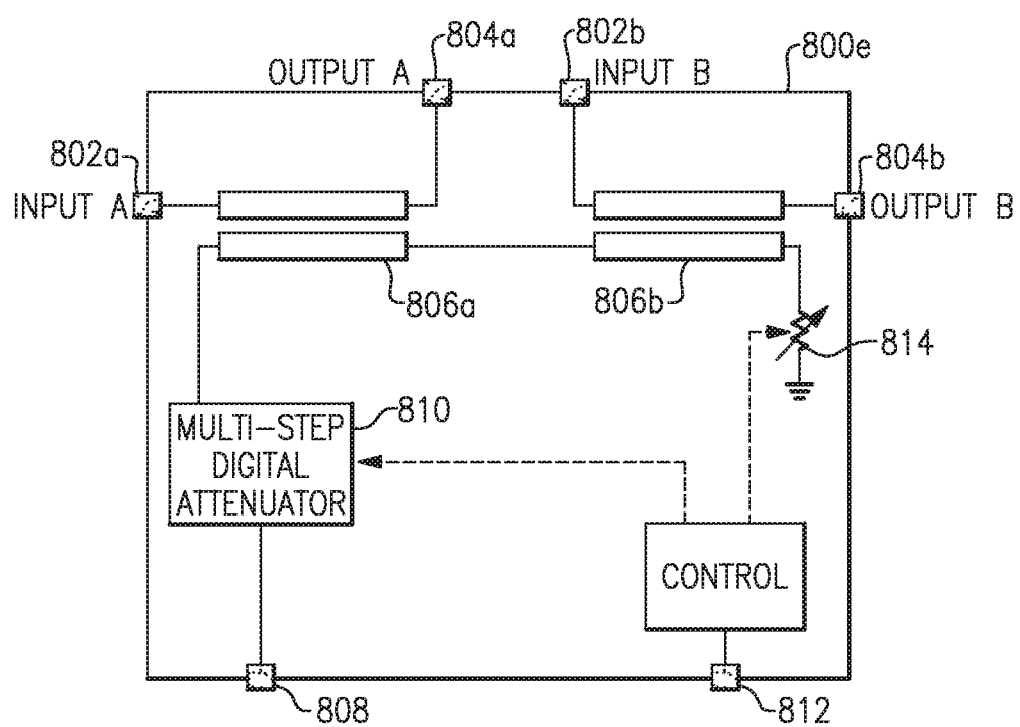

FIG. 8E is a block diagram of another example of a coupler module 800e. In this example, the coupler module 800e includes two couplers, 806a and 806b, that may be designed to operate for different frequencies or frequency bands. The coupler module 800e is an example of a dual-band attenuated coupler module. Each of the couplers 806a, 806b has an input 802a, 802b, respectively, and an output 804a, 804b, respectively. As shown, the coupling lines of the couplers 806a, 806b are connected in series and each provides a forward coupled signal to an attenuator 810. A signal provided at coupled output 808 is an attenuated combination of a coupled signal from the first coupler 806a in the first frequency band and a coupled signal from the second coupler 806b in the second frequency band.

Figure 8F:
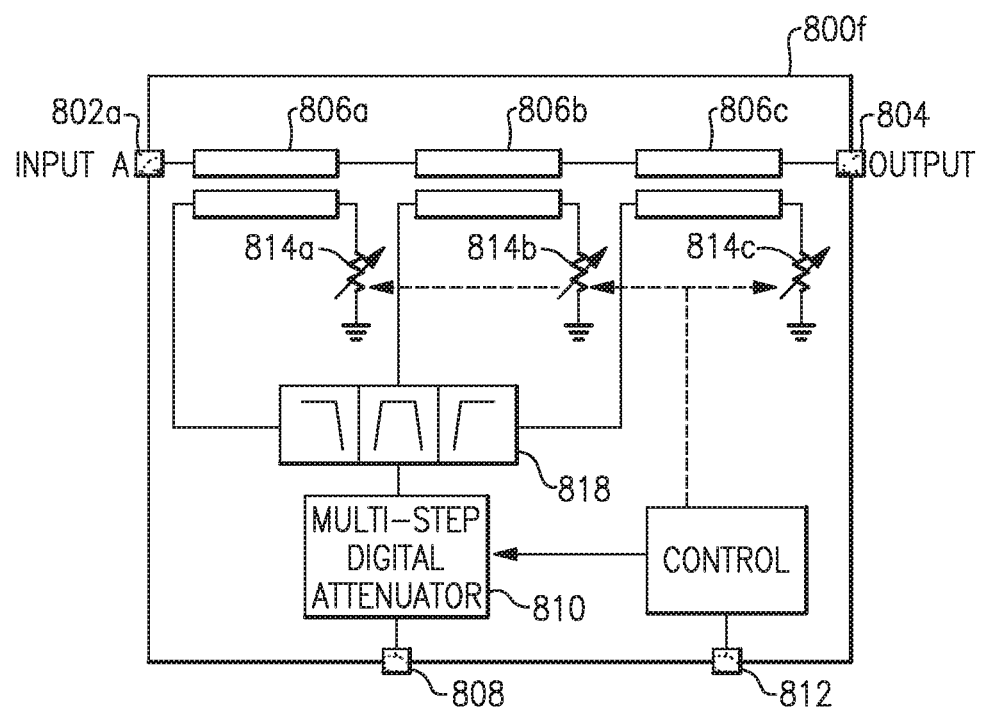

FIG. 8F is a block diagram of another example of a coupler module 800f. The coupler module 800f may be an example of a tri-band attenuated coupler module. The coupler module 800f includes three couplers 806a, 806b, 806c, that may be designed to operate for different frequencies or frequency bands. The coupled output of each coupler 806a, 806b, 806c, is combined by a triplexer 818 that provides combined coupled signals to the attenuator 810.

While FIGS. 8A through 8F illustrate various embodiments of a coupler module with an attenuator 810, other embodiments may be arranged differently. For example, a coupler module may have any number of one or more couplers whose various ports may be provided in various ways, and whose coupled outputs may be combined in various ways (e.g., by series connection, by a combiner, etc.), and whose connectivity to termination impedances, combiners, and/or attenuators may be selectively switched. Accordingly, any number of couplers, attenuators, switches, combiners, and impedances may be arranged in various fashions to accommodate various application needs and/or operational characteristics. Additionally, a control circuit may control the various switches, adjustable impedances, and attenuation settings. Any of the modules may include packaging structures to provide protection and facilitate handling of the modules.

Figure 9A:
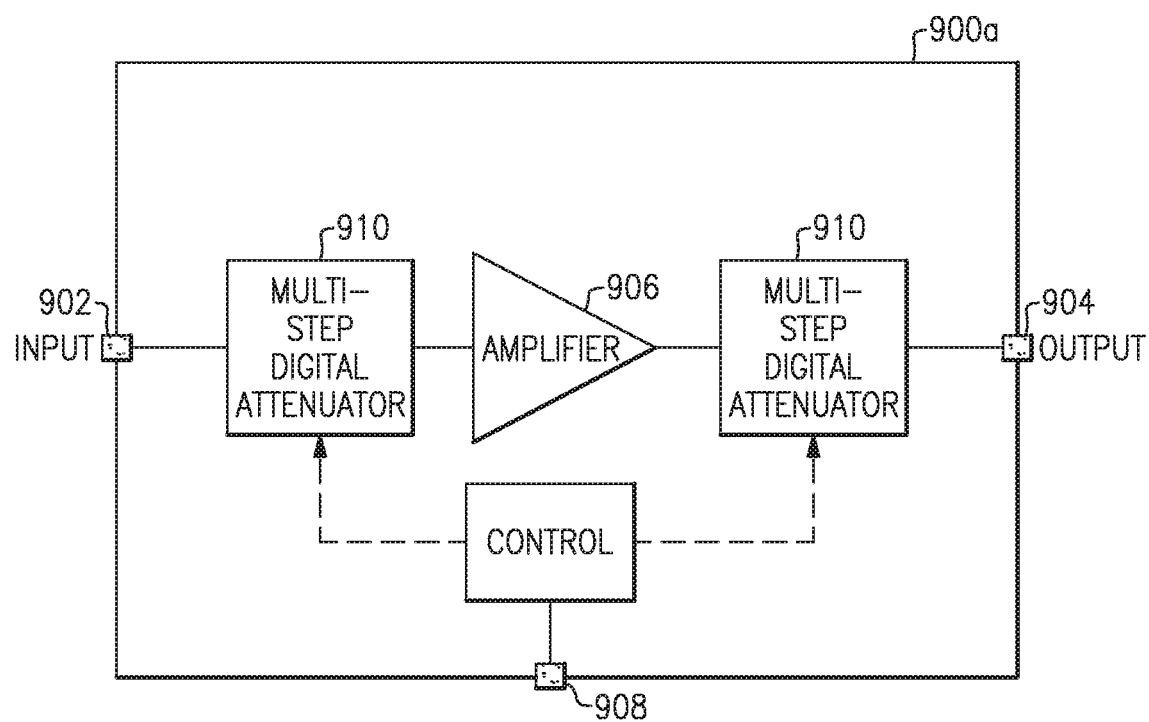
FIGS. 9A-9C are block diagrams of example amplifier modules including an attenuation circuit.

FIG. 9A is a block diagram of an example of an amplifier module 900a that includes two attenuators 910 configured to attenuate signals associated with a power amplifier 906. Similar to module 700 and the modules 800a-f above, the module 900a may include packaging and connectivity to the exterior. In the example module 900a of FIG. 9A, shown are connections for the input 902 and output 904. A control interface 908 of the attenuators 910 is also shown. The attenuators 910 may attenuate an input signal before the signal is amplified by the power amplifier 906, or may attenuate an amplified signal provided by the power amplifier 906, or both. The module 900a may have an alternate arrangement having only one of the attenuators 910. As shown, two (or more) attenuators 910 could be provided and connected such that attenuation occurs on both the input and the output of the power amplifier 906, which may yield flexibility in balancing or achieving total gain, noise figures, and other operational parameters. Accordingly, the amplifier module 900a may act as a variable gain amplifier because the ratio of the output signal to the input signal may be adjusted by the configurable attenuators 910.

Figure 9B:
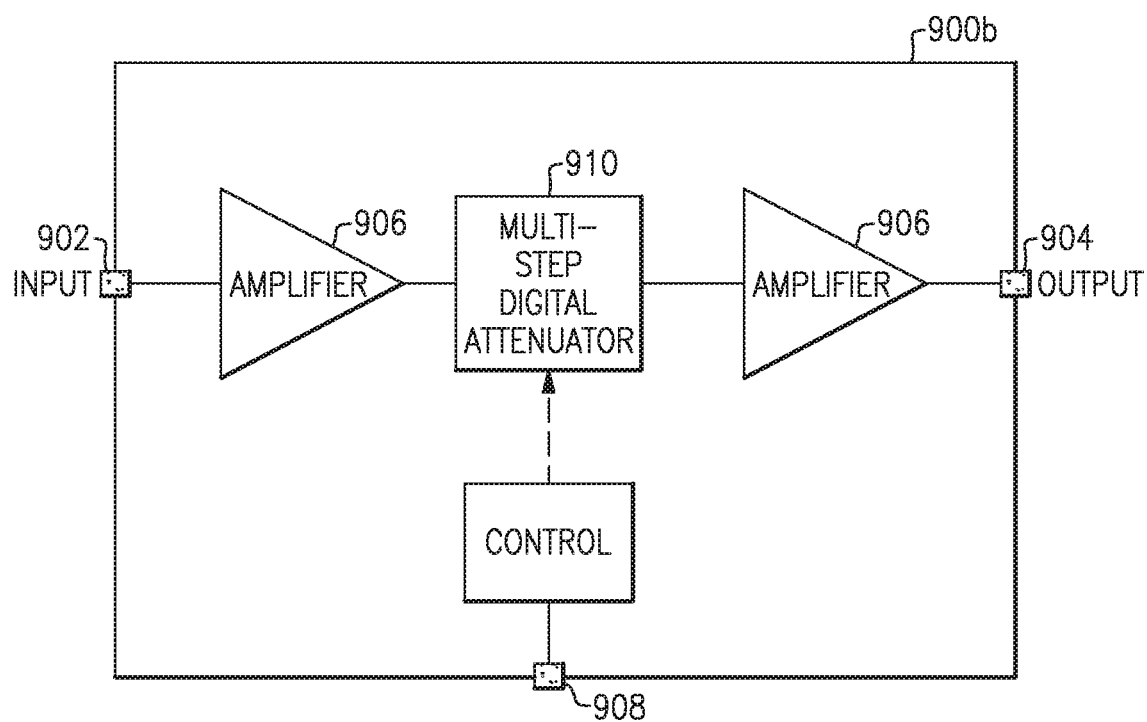

FIG. 9B is a block diagram of another example of an amplifier module 900b. The amplifier module 900b includes two amplifiers 906 coupled in series on either side of a single attenuator 910. The amplifiers 906 may be adjustable gain amplifiers. The amplifier module 900b may include packaging as discussed above. The arrangement of amplifiers 906 and the attenuator 910 is one example of an arrangement that may allow flexibility in balancing or achieving total gain, noise figures, and other operational parameters as a variable gain amplifier. Alternate amplifier modules may include both multiple amplifiers and multiple attenuators for increased flexibility, and may include switching components to flexibly route signals.

Figure 9C:
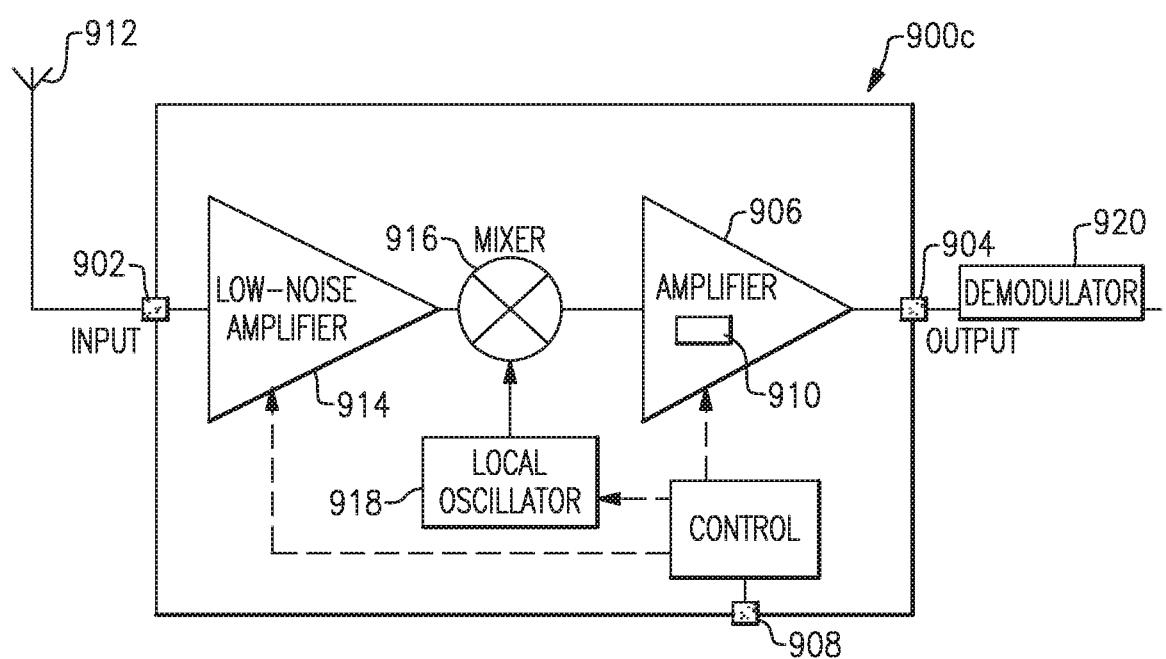

FIG. 9C is a block diagram of an example of an intermediate frequency (IF) amplifier module 900c that includes an attenuator 910. The IF amplifier module 900c is shown in an example use with an antenna 912 that may receive a radio frequency (RF) signal and provide it to the input 902, from which a low-noise amplifier 914 boosts the signal strength. The amplified RF signal is mixed by a mixer 916 with an IF waveform from a local oscillator 918 and provided to an IF amplifier 906. In the example module 900c, the IF amplifier 906 has at least one integrated attenuator 910, similar to the amplifier module of FIG. 9A, to allow variable gain adjustment. The amplified IF signal may be provided to a demodulator 920 coupled to the output 904 of the IF amplifier module 900c. Similar to the example modules previously described, the IF amplifier module 900c may have a control interface 908. Alternate embodiments may include one or more attenuators 910 coupled to the input or output of amplifier 906 rather than integrated with the amplifier 906.

While FIGS. 9A through 9C illustrate various embodiments of an amplifier module with an attenuator 910, other embodiments may be arranged differently.

FIGS. 7-9 described above illustrate various example modules that include at least one attenuator as disclosed herein. Other modules in accord with those disclosed herein may include other components and features, such as, for example, a sensor, an antenna switch module, a transmitter, receiver, or transceiver, and any combination of the disclosed or other components. An attenuator of the types disclosed herein may be incorporated into any number of packages, modules, or devices to accommodate changing operational parameters or specific applications.

Figure 10:
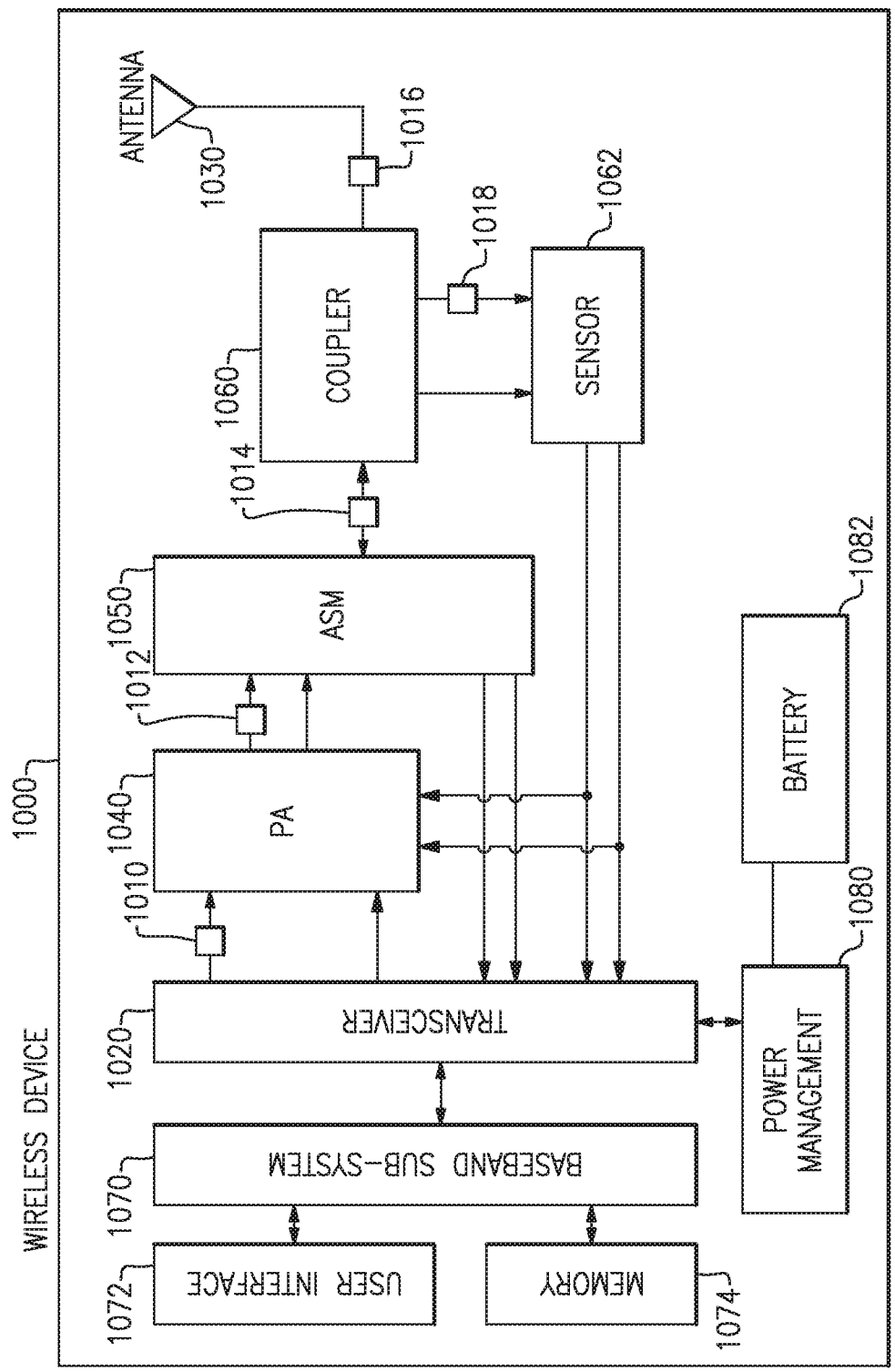
FIG. 10 is a block diagram of an example device that may include one or more attenuation circuits.

In an embodiment, an attenuator of the types disclosed herein may be incorporated into an electronic device. An example of such a device is shown in FIG. 10, which is a block diagram of a wireless device 1000 that can have one or more attenuators in accordance with any of the principles and advantages discussed herein. The example wireless device 1000 may be, for example, a mobile phone, a smart phone, a tablet, a wireless access point, a router, a modem, or the like. A wireless device may include additional elements not shown in FIG. 10 and/or may include a subcombination of those elements shown.

The example wireless device 1000 includes an antenna 1030 for transmitting and receiving wireless radio frequency (RF) signals. A coupler 1060 may provide to a sensor 1062 a coupled signal of the RF signal going to or from the antenna 1030, for monitoring and adjusting power levels and/or antenna mismatch characteristics. An antenna switch module 1050 may control or direct received RF signals from the antenna 1030 to a transceiver 1020, and control or direct RF signals from a power amplifier 1040 to the antenna 1030. The transceiver 1020 may be controlled by a baseband sub-system 1070 having a user interface 1072 and a memory 1074, and the example wireless device 1000 may have a power management system 1080 and a battery 1082.

One or more attenuators in accord with those disclosed herein may be incorporated in the wireless device 1000 in a number of configurations in accord with desired operational characteristics of the wireless device 1000. For example, an attenuator 1010 may be included to attenuate an input signal to the power amplifier 1040. An attenuator 1012 may attenuate an output signal of the power amplifier 1040. An attenuator 1014 and/or an attenuator 1016 may attenuate a transmit or receive signal, or both, between the antenna switch module 1050 and the antenna 1030, with or without a coupler 1060 in between. Additionally, a coupled output from the coupler 1060 may be configured with an attenuator 1018. Any of the attenuators 1010, 1012, 1014, 1016, and 1018 may be present, or additional attenuators may be present, in various additional or alternate arrangements, to attenuate a signal at varying locations to accommodate changing operational parameters or applications.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An attenuation circuit comprising:
   an input to receive an input signal;
   an output to provide an output signal;
   an attenuator including a plurality of attenuation impedances selectively coupled between the input and the output, the attenuator being a multi-step attenuator configured to attenuate the input signal among a plurality of steps, each step providing one of a plurality of desired levels of attenuation, the attenuator further including a plurality of switched calibration impedances, each of the plurality of switched calibration impedances being coupled in parallel with at least one of the plurality of attenuation impedances and configured to be switchably selectable to upwardly and downwardly adjust an actual level of attenuation of the attenuator to achieve the desired level of attenuation at any given step to compensate for manufacturing variances of the plurality of attenuation impedances;
   a bypass switch constructed and arranged to provide a bypass path that selectively couples the input to the output through the bypass switch in a bypass mode; and
   a first isolation switch coupled in series with the attenuator between the input and the output, the first isolation switch and the attenuator being coupled in parallel with the bypass switch, the first isolation switch being constructed and arranged to selectively isolate the attenuator from one of the input and the output so that no signal path other than the bypass path couples the input to the output when in the bypass mode.

2. The attenuation circuit of claim 1 wherein the first isolation switch includes a plurality of first transistors connected in series.

3. The attenuation circuit of claim 2 wherein the first isolation switch includes at least one second transistor having a first terminal coupled between two of the plurality of first transistors and a second terminal coupled to ground.

4. The attenuation circuit of claim 1 further comprising a second isolation switch, the first isolation switch positioned in series between the input and the attenuator and configured to selectively isolate the attenuator from the input, and the second isolation switch positioned in series between the output and the attenuator and configured to selectively isolate the attenuator from the output.

5. The attenuation circuit of claim 1 wherein the attenuator includes two first impedances coupled in series between the input and the output, a second impedance having a first terminal coupled between the two first impedances and a second terminal coupled to ground, and a third impedance coupled in parallel with the two first impedances between the input and the output.

6. The attenuation circuit of claim 1 wherein the plurality of switched calibration impedances is configured to upwardly and downwardly adjust the actual level of attenuation by a nominal 0.1 dB.

7. The attenuation circuit of claim 1 wherein the plurality of switched calibration impedances includes a first switched calibration impedance selectively connected between the input and the output and a second switched calibration impedance selectively providing a signal path to a ground node.

8. The attenuation circuit of claim 7 wherein the first switched calibration impedance and the second switched calibration impedance are configured to provide approximately 0.1 dB adjustment to the actual level of attenuation at a respective step.

9. An electromagnetic coupler module comprising:
   an input, an output, and a coupled port;
   an electromagnetic coupler connected between the input and the output, the electromagnetic coupler being configured to electromagnetically couple a portion of a signal traveling between the input and the output and to provide the coupled portion at the coupled port;
   an attenuator including a plurality of attenuation impedances selectively connected to the coupled port, the attenuator being a multi-step attenuator configured to selectively attenuate the coupled portion among a plurality of steps, each step providing one of a plurality of desired levels of attenuation, the attenuator being further configured to provide an attenuated coupled portion to a node, and the attenuator further including a plurality of switched calibration impedances, each of the plurality of switched calibration impedances being coupled in parallel with at least one of the plurality of attenuation impedances and configured to be switchably selectable to upwardly and downwardly adjust an actual level of attenuation of the attenuator to achieve the desired level of attenuation at any given step to compensate for manufacturing variances of the plurality of attenuation impedances;
   a bypass switch constructed and arranged to provide a bypass path that selectively connects the coupled port to the node through the bypass switch when in a bypass mode; and
   a first isolation switch connected in series with the attenuator between the coupled port and the node, the first isolation switch and the attenuator being coupled in parallel with the bypass switch, the first isolation switch being constructed and arranged to selectively isolate the attenuator from one of the coupled port and the node so that no signal path other than the bypass path couples the coupled port to the node when in the bypass mode.

10. The coupler module of claim 9 wherein the first isolation switch includes a plurality of first transistors connected in series.

11. The coupler module of claim 10 wherein the first isolation switch includes at least one second transistor having a first terminal coupled between two of the plurality of first transistors and a second terminal coupled to ground.

12. The coupler module of claim 9 further comprising a second isolation switch, the first isolation switch connected in series between the coupler and the attenuator and configured to selectively isolate the attenuator from the coupler and the second isolation switch connected between the attenuator and the coupled port and configured to selectively isolate the attenuator from the coupled port.

13. The coupler module of claim 9 wherein the attenuator includes two first impedances coupled in series between the coupler and the coupled port, a second impedance having a first terminal coupled between the two first impedances and a second terminal coupled to ground, and a third impedance coupled in parallel with the two first impedances between the coupler and the coupled port.

14. A wireless device comprising:
a transceiver configured to produce a transmit signal and to receive a receive signal; and
an attenuation circuit configured to selectively attenuate an input signal, the input signal being at least one of the transmit signal, the receive signal, and a derived signal derived from at least one of the transmit signal and the receive signal, the attenuation circuit including an input to receive the input signal, an output to provide an attenuated signal, an attenuator including a plurality of attenuation impedances selectively coupled between the input and the output to provide an attenuation among a plurality of steps, each step providing one of a plurality of desired levels of attenuation, and further including a plurality of switched calibration impedances, each of the plurality of switched calibration impedances being coupled in parallel with at least one of the plurality of attenuation impedances and configured to be switchably selectable to upwardly and downwardly adjust an actual level of attenuation of the attenuator to achieve the desired level of attenuation at any given step to compensate for manufacturing variances of the plurality of attenuation impedances, a bypass switch constructed and arranged to provide a bypass path that selectively couples the input to the output through the bypass switch in a bypass mode, and a first isolation switch coupled in series with the attenuator between the input and the output, the first isolation switch and the attenuator being coupled in parallel with the bypass switch, the first isolation switch being constructed and arranged to selectively isolate the attenuator from one of the input and the output so that no signal path other than the bypass path couples the input to the output when in the bypass mode.

15. The wireless device of claim 14 further comprising an antenna coupled to the transceiver and configured to transmit the transmit signal and to receive the receive signal.

16. The wireless device of claim 14 wherein the first isolation switch includes a plurality of first transistors connected in series.

17. The wireless device of claim 16 wherein the first isolation switch includes at least one second transistor having a first terminal coupled between two of the plurality of first transistors and a second terminal coupled to ground.

18. The wireless device of claim 14 further comprising a second isolation switch, the first isolation switch positioned in series between the input and the attenuator and configured to selectively isolate the attenuator from the input, and the second isolation switch positioned in series between the output and the attenuator and configured to selectively isolate the attenuator from the output.

19. The wireless device of claim 14 wherein the attenuator includes two first impedances coupled in series between the input and the output, a second impedance having a first terminal coupled between the two first impedances and a second terminal coupled to ground, and a third impedance coupled in parallel with the two first impedances between the input and the output.

20. The wireless device of claim 14 further comprising at least one of a sensor, a memory, a baseband sub-system, a user interface, an antenna switch module, a power amplifier, an electromagnetic coupler, and a battery.

* * * * *